US009793289B2

United States Patent
Uechi et al.

(10) Patent No.: US 9,793,289 B2
(45) Date of Patent: Oct. 17, 2017

(54) NON-VOLATILE MEMORY DEVICE

(71) Applicant: Toshiba Memory Corporation, Minato-ku (JP)

(72) Inventors: Tadayoshi Uechi, Kawasaki (JP); Masaki Kondo, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/951,721

(22) Filed: Nov. 25, 2015

(65) Prior Publication Data

US 2016/0358936 A1    Dec. 8, 2016

Related U.S. Application Data (60) Provisional application No. 62/172,468, filed on Jun. 8, 2015.

(51) Int. Cl.
*H01L 27/1157* (2017.01)
*H01L 27/11582* (2017.01)

(52) U.S. Cl.
CPC .... *H01L 27/11582* (2013.01); *H01L 27/1157* (2013.01)

(58) Field of Classification Search
CPC ......... H01L 27/10838; H01L 27/11551; H01L 27/11561; H01L 21/28088; H01L 21/28185; H01L 29/66825; H01L 21/8221; H01L 27/11573; G11C 14/00; G11C 13/0007; G11C 16/0483

See application file for complete search history.

(56) References Cited

U.S. PATENT DOCUMENTS

| | | | |
|---|---|---|---|
| 7,018,898 B2 | 3/2006 | Schuler et al. | |
| 7,528,447 B2 | 5/2009 | Enda et al. | |
| 8,134,203 B2 | 3/2012 | Izumida et al. | |
| 2005/0062098 A1* | 3/2005 | Mahajani | H01L 21/28185 257/324 |
| 2005/0162896 A1* | 7/2005 | Jung | G11C 14/00 365/154 |
| 2007/0190721 A1* | 8/2007 | Cha | H01L 21/28088 438/257 |
| 2007/0252201 A1 | 11/2007 | Kito et al. | |
| 2008/0244481 A1 | 10/2008 | Kinoshita et al. | |
| 2008/0308870 A1* | 12/2008 | Faul | H01L 27/10838 257/368 |
| 2009/0230459 A1* | 9/2009 | Kito | H01L 27/11565 257/324 |
| 2009/0321813 A1 | 12/2009 | Kidoh et al. | |

(Continued)

*Primary Examiner* — Kenneth Parker
*Assistant Examiner* — Fang-Xing Jiang
(74) *Attorney, Agent, or Firm* — Oblon, McClelland, Maier & Neustadt, L.L.P.

(57) ABSTRACT

A non-volatile memory device includes a conductive layer, a first electrode layer provided side by side with the conductive layer in a first direction, a second electrode layer provided between the conductive layer and the first electrode. At least a part of the second electrode on the conductive layer side has a work function smaller than a work function of the first electrode. The device further includes a first channel body extending through the first electrode layer in the first direction and a charge storage portion provided between the first electrode layer and the first channel body.

17 Claims, 10 Drawing Sheets

(56) References Cited

U.S. PATENT DOCUMENTS

| | | | |
|---|---|---|---|
| 2010/0006922 A1* | 1/2010 | Matsuoka | G11C 16/0483 257/324 |
| 2010/0243983 A1* | 9/2010 | Chiang | G11C 13/0007 257/4 |
| 2010/0327339 A1* | 12/2010 | Tanaka | H01L 27/11573 257/324 |
| 2011/0284947 A1* | 11/2011 | Kito | H01L 21/8221 257/324 |
| 2013/0264626 A1* | 10/2013 | Sawa | H01L 29/66825 257/316 |
| 2015/0076580 A1* | 3/2015 | Pachamuthu | H01L 27/11551 257/314 |

* cited by examiner

NON-VOLATILE MEMORY DEVICE

CROSS-REFERENCE TO RELATED APPLICATIONS

This application is based upon and claims the benefit of priority from U.S. Provisional Patent Application 62/172,468 filed on Jun. 8, 2015; the entire contents of which are incorporated herein by reference.

FIELD

Embodiments are generally related to a non-volatile memory device.

BACKGROUND

A two dimensional memory device has a storage capacity that depends on the restrictions in the manufacturing process thereof, such as the resolution limit of photolithography. In order to overcome this limitation, a three-dimensional memory device has been under development, which comprises memory cells disposed along semiconductor channels extending in a direction perpendicular to a substrate. In such a memory device, however, a variation of electric resistance between the memory cells and a source interconnect sometimes causes a channel current flowing through the memory cells to change, resulting in the deterioration of performance such as accuracy of data readout. Hence, there is a demand for suppressing the variation of the channel current.

DETAILED DESCRIPTION

According to one embodiment, a non-volatile memory device includes a conductive layer, a first electrode layer provided side by side with the conductive layer in a first direction, a second electrode layer provided between the conductive layer and the first electrode. At least a part of the second electrode on the conductive layer side has a work function smaller than a work function of the first electrode. The device further includes a first channel body extending through the first electrode layer in the first direction and a charge storage portion provided between the first electrode layer and the first channel body.

Various embodiments will be described hereinafter with reference to the accompanying drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1:
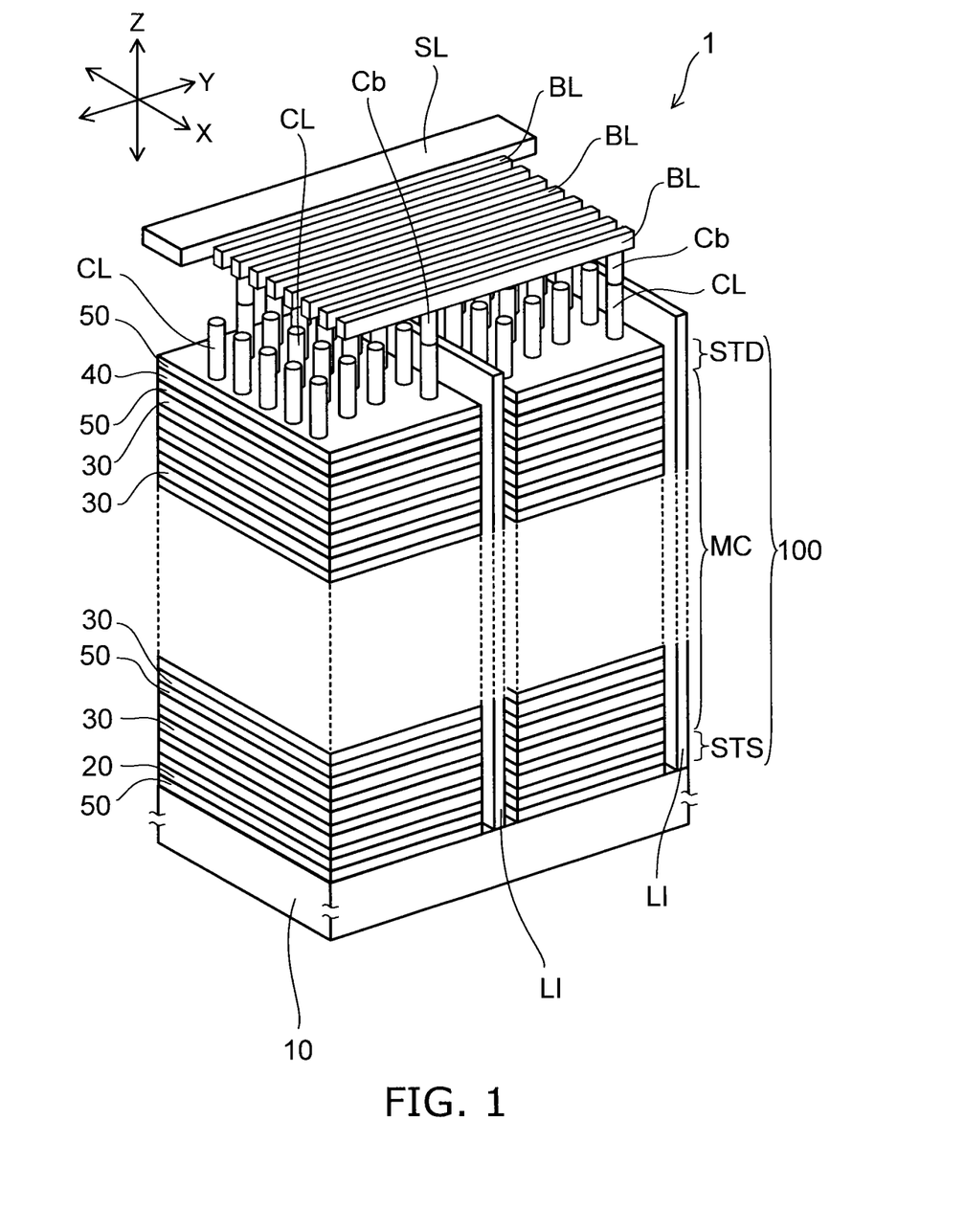
FIG. 1 is a perspective view schematically showing a non-volatile memory device according to a first embodiment.

FIG. 1 is a perspective view schematically showing a memory cell array 1 of a non-volatile memory device according to an embodiment.

As shown in FIG. 1, the memory cell array 1 includes a source layer 10, a stacked body 100 provided on the source layer 10, and upper interconnects provided on the stacked body 100. The upper interconnects are, for example, bit lines BL and a source line SL. The memory cell array 1 further includes a plurality of columnar sections CL and a conductor LI.

The columnar sections CL extend in a first direction (a Z-direction) in the stacked bodies 100. The columnar sections CL include channel bodies 60 and memory films 70 (see FIG. 2A). The columnar sections CL have, for example, a circular or elliptical shape in a cross-section perpendicular to the Z-direction. The columnar sections CL are disposed, for example, in zigzag in top view of the stacked body 100. The columnar sections CL may be disposed, for example, at equal intervals in an X-direction and a Y-direction. The conductor LI extends, for example, in the Z-direction and the X-direction between stacked bodies 100 adjacent to each other in a second direction (the Y-direction).

A plurality of bit lines BL and a plurality of source lines SL are provided on the stacked body 100. For example, the respective plurality of bit lines BL extend in the Y-direction and are provided in parallel in the X-direction. For example, the source line SL extends in the Y-direction and is provided in parallel to the bit lines BL.

The channel bodies 60 in the columnar sections CL are electrically connected to the bit lines BL via contact sections Cb that are in contact with the upper ends of the channel bodies 60. For example, in a plurality of stacked bodies 100 disposed in the Y-direction, a channel body 60 included in one of the plurality of columnar sections CL extends through each of the stacked bodies 100, and is electrically connected to one of the bit lines BL. A plurality of channel bodies 60 electrically connected to the one of the bit lines BL is respectively included in the columnar sections CL extending through different stacked bodies 100. The lower ends of the columnar sections CL are in contact with, for example, the source layer 10.

The source layer 10 is electrically connected to the source line SL via the conductor LI. The lower end of the conductor LI is in contact with, for example, the source layer 10. The upper end of the conductor LI is electrically connected to the source line SL in a portion not shown.

The stacked body 100 includes an electrode layer 20, a plurality of electrode layers 30, an electrode layer 40, and a plurality of insulating layers 50. The electrode layer 20, the plurality of electrode layers 30 and the electrode layer 40 are stacked in the Z-direction in order. The insulating layers 50 are disposed between the source layer 10 and the electrode layer 20, between the electrode layer 20 and the electrode layer 30, among the electrode layers 30 adjacent to one another in the Z-direction, and between the electrode layer 30 and the electrode layer 40. The electrode layers 20, 30, and 40 are metal layers which include at least one of, for example, tungsten (W), molybdenum (Mo), aluminum (Al), copper (Cu), and ruthenium (Ru). The insulating layers 50 include, for example, silicon oxide or silicon nitride.

Memory cells MC are provided in portions where the columnar sections CL extend through the electrode layers 30. The electrode layers 30 act as control gates of the memory cells MC. The memory cells MC are disposed in the Z-direction along the columnar sections CL. The number of stacked layers of the electrode layers 30 in the Z-direction is equal to the number of the memory cells MC disposed in the Z-direction.

Selection transistors STS on a source side are provided in portions where the columnar sections CL extend through the electrode layer 20. Selection transistors STD on a drain side are provided in portions where the columnar sections CL extend through the electrode layer 40. The columnar sections CL respectively include NAND strings. The NAND strings include the plurality of memory cells MC provided side by side in the Z-direction along the columnar sections CL and the selection transistors STS and STD. The memory cells MC are disposed between the selection transistors STS and STD.

Figure 2A:
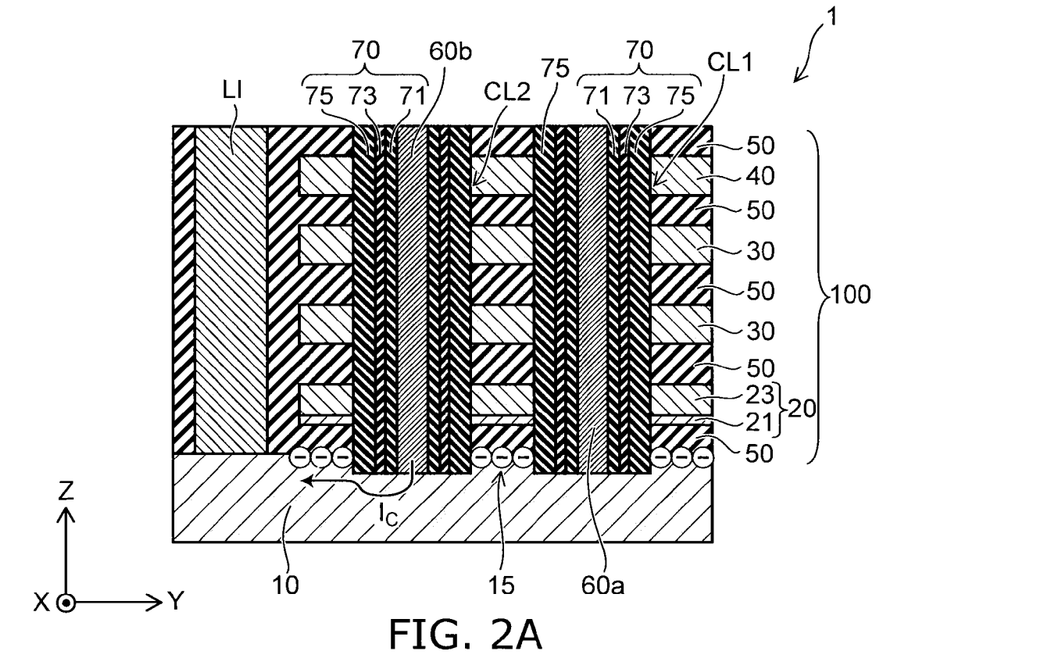
FIGS. 2A and 2B are schematic views showing the non-volatile memory device according to the first embodiment.
Figure 2B:
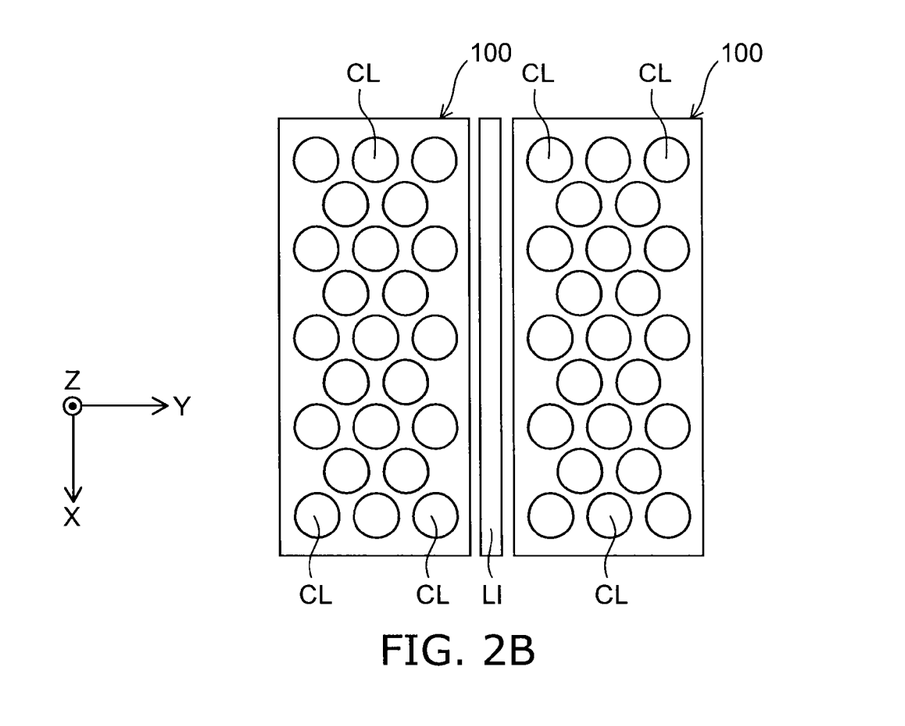

FIGS. 2A and 2B are schematic views showing the memory cell array 1. FIG. 2A shows a cross section of the memory cell array 1. FIG. 2B shows an upper surface of the stacked body 100. FIG. 2A is a simplified drawing with the reduced number of the electrode layers 30 and the columnar sections CL.

As shown in FIG. 2A, the memory cell array 1 includes the source layer 10 and the stacked body 100. The source layer 10 is, for example, a p-type well provided on a silicon substrate.

The stacked body 100 is provided on the source layer 10. The insulating layer 50 is provided as the bottom layer directly on the source layer 10, for example. Columnar sections CL1 and CL2 extend in the Z-direction in the stacked body 100. The lower ends of the columnar sections CL are located in the source layer 10.

The columnar section CL1 includes a channel body 60a and the memory film 70. The columnar section CL2 includes a channel body 60b and the memory film 70. The channel bodies 60a and 60b are semiconductor layers of silicon or the like. In the specification, the columnar sections are individually represented by CL1 and CL2 in some case, and are represented as a whole by CL in other cases. Other components are also represented in the same manner.

The memory film 70 extends in the Z-direction and includes, for example, a tunnel insulating film 71, a charge storage portion 73 and an insulative blocking film 75 in order from the channel body 60 side. The tunnel insulating film 71 include, for example, at least one of silicon oxide and silicon nitride, and are in contact with the channel bodies 60.

The charge storage portion 73 includes, for example, at least one of silicon oxide, silicon nitride, polycrystalline silicon, and metal. The charge storage portions 73 may include a multilayer structure. In this example, the charge storage portions 73 extend in the Z-direction along the channel bodies 60. However, the embodiment is not limited to this. For example, charge storage portions may be discretely disposed along a channel body 60 in the Z-direction, each of which is provided between an electrode layer 30 and the channel body 60.

The insulative blocking films 75 include, for example, at least one of silicon oxide and silicon nitride. The insulative blocking films 75 may include, for example, metal oxide such as hafnium oxide. The insulative blocking films 75 may include, for example, a multilayer structure.

The memory cells MC are provided in portions where a columnar section CL extends through the electrode layers 30. The memory cells MC share a channel body 60, a tunnel insulating film 71, a charge storage portion 73 and an insulative blocking film 75.

The selection transistors STS are provided in portions where the columnar sections CL extends through the electrode layer 20. A selection transistor STS shares the channel body 60 and the memory film 70 with the memory cells MC. The electrode layer 20 acts as a selection gate electrode. A part of the memory films 70 acts as the gate insulating film.

The electrode layer 20 is provided at a position closest to the source layer 10 among the plurality of electrode layers 20, 30, and 40. The electrode layer 20 includes, for example, a first layer 21 and a second layer 23. The first layer 21 faces the source layer 10 via a bottom layer of the insulating layers 50. The first layer 21 includes a material that has a work function smaller than a work function of a material included in the electrode layers 30 and 40. The second layer 23 includes, for example, a same material as the material included in the electrode layers 30 and 40. Thus, the work function of the first layer 21 is smaller than the work function of the second layer 23.

The selection transistors STD are provided in portions where the columnar sections CL extends through the electrode layer 40. A selection transistor STD shares the channel body 60 and the memory films 70 with the memory cells MC. The electrode layer 40 acts as a selection gate electrode. A part of the memory films 70 acts as gate insulating films.

A conductor LI is provided, for example, between the stacked bodies 100 adjacent to each other in the Y-direction. The conductor LI is provided, for example, with a length from a surface at the same level as the upper surface of the stacked body 100 to an end in the source layer so as to extend into the source layer 10.

As shown in FIG. 2A, for example, when data is read out from the memory cells MC, a channel current Ic flows through a channel body 60. The channel current Ic flows from the channel body 60 to the source line SL via the conductor LI. The channel current Ic flows via an inversion layer 15 formed on the source layer 10 side at the interface between the insulating layer 50 and the source layer 10. Thus, the electric resistance between the channel body 60 and the conductor LI varies depending on a distance between the conductor LI and the columnar sections CL that includes the channel body 60.

For example, a distance between the conductor LI and a columnar section CL1 including a channel body 60a is longer than the distance between the conductor LI and the columnar section CL2 including a channel body 60b. Thus, an electric resistance between the channel body 60a and the conductor LI is larger than an electric resistance between the channel body 60b and the conductor LI.

As shown in FIG. 2B, the stacked bodies 100 are disposed side by side in the Y-direction. For example, the conductor LI is provided between the stacked bodies 100 adjacent to each other in the Y-direction and extends in the X-direction. A plurality of columnar sections CL are provided in each stacked body 100. As shown in FIG. 2B, there are various distances between each columnar section CL and the conductor LI. Thus, the electric resistance between a channel body 60 in each columnar section CL and the conductor LI is not constant.

In the embodiment, the electron density of the inversion layer 15 may become larger by disposing the first layer 21, which includes the material having the smaller work function, on the source layer 10 side of the electrode layer 20. Thereby, it becomes possible to reduce the electric resistance of the inversion layer 15 and suppress the dispersion of the various electric resistance between each channel body 60 and the conductor LI.

Metal materials usable in the electrode layers 20, 30, and 40 are cited in Table 1 with melting points and work functions thereof. For example, it is preferable to use a material that is thermally stable and increases a threshold voltage as a control gate electrode of the memory cell and the selection gate electrode. Such an electrode material may have a higher melting point and a larger work function. Among the metal materials cited in Table 1, for example, tungsten (W) is suitable for the control gate electrode and the selection gate electrode. Thus, a material having a work function smaller than the work function of tungsten can be used for the first layer 21. Since all of tantalum, hafnium, titanium, tantalum carbide, hafnium carbide, and tantalum nitride cited in Table 1 have work functions smaller than the work function of tungsten, these can be used as the material of the first layer 21.

TABLE 1

|  | Melting Point | Work Function |
|---|---|---|
| W | 3382 | 4.52 |
| TaC | 3880 | 4.0~4.3 |
| HfC | 3900 | 4.0~4.3 |
| Ta | 2996 | 4.19 |
| Hf | 2222 | 3.9 |
| Ti | 1727 | 4.14 |

Figure 3:
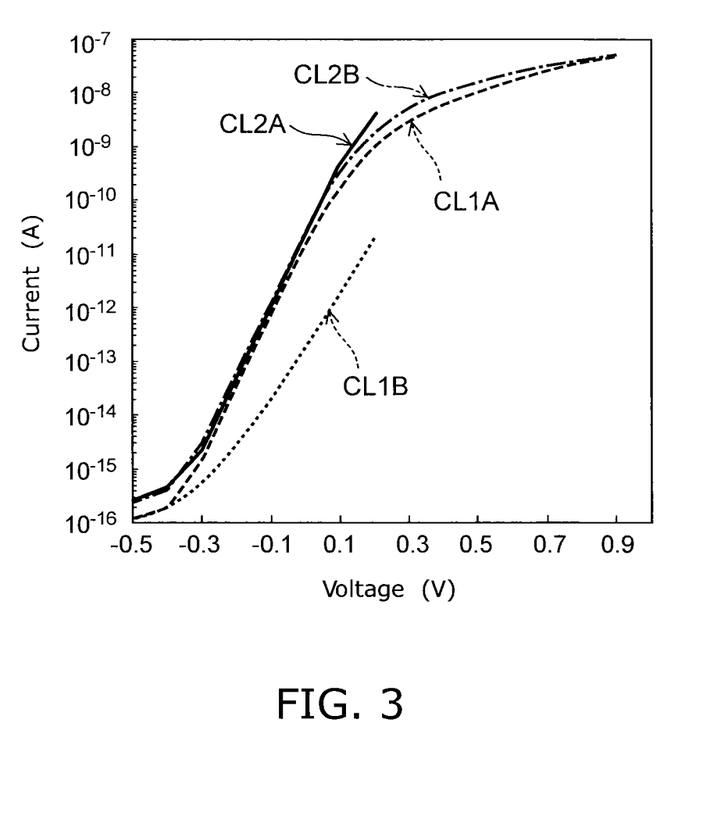
FIG. 3 is a graph showing characteristics of the memory cells.

FIG. 3 is a graph showing characteristics of the selection transistors STS. The vertical axis is a channel current value (ampere: A), and the horizontal axis is a voltage (volt: V) of a selection gate, i.e. the electrode layer 20. The voltage current characteristics CL1A, CL2A, CL1B, and CL2B are shown in FIG. 3.

CL1A and CL2A each indicates a characteristic of the selection transistor STS at the columnar section CL1 and a characteristic of the selection transistor STS at the columnar section CL2 in the memory cell array 1. On the other hand, CL1B and CL2B each indicates a characteristic of the selection transistor STS at the columnar section CL1 and a characteristic of the selection transistor STS at the columnar section CL2 in a memory cell array according to a comparative example (not shown). In the memory cell array according to the comparative example, the first layer 21 is not provided in the electrode layer 20.

As shown in FIG. 3, a current value of CL1B is lower than a current value of CL2B. A difference between the current values is larger than a difference between current values of CL1A and CL2A. That is, in the memory cell array in which the first layer 21 is not provided, the electron density of the inversion layer 15 is smaller and the electric resistance of the inversion layer 15 is larger than those in the memory cell array 1. Thus, in the memory cell array without the first layer 21, a decreased amount of a channel current becomes larger at a columnar section located with a longer distance from the conductor L1.

Thus, in the embodiment, it becomes possible to reduce the electric resistance of the inversion layer 15 and suppress the variations of the channel currents by providing the electrode layer 20 with the first layer 21 on the side facing the source layer 10.

Then, a method for manufacturing the non-volatile memory device according to the first embodiment is described with reference to FIGS. 4A to 4F. FIGS. 4A to 4F are schematic sectional views showing a manufacturing process of the memory cell array 1 in order.

Figure 4A:
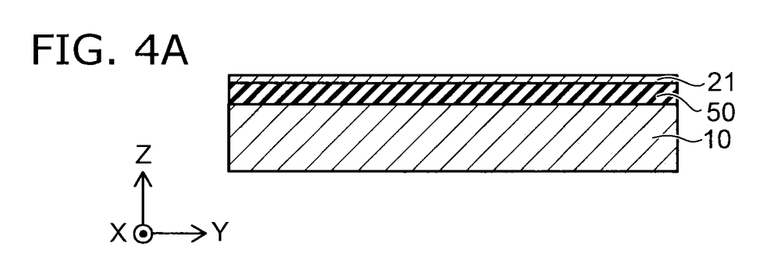
FIGS. 4A to 4F are schematic sectional views showing a manufacturing process of the non-volatile memory device according to the first embodiment.

As shown in FIG. 4A, a first insulating layer 50 is formed on the source layer 10. A first layer 21 is formed on the first insulating layer 50. The first insulating layer 50 is, for example, a silicon oxide layer formed using Chemical Vapor Deposition (CVD). The first layer 21 is, for example, tantalum carbide (TaC) layer formed using CVD.

Figure 4B:
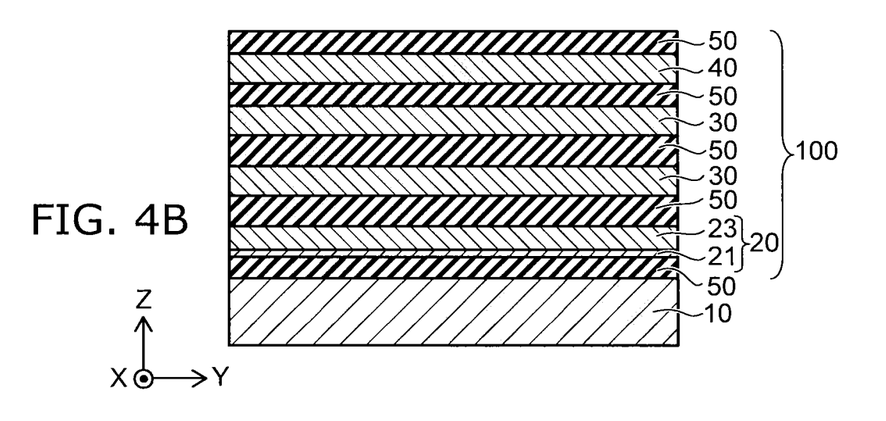

As shown in FIG. 4B, a second layer 23 is formed on the first layer 21. Electrode layers 30 and 40 and insulating layers 50 are further stacked to form a stacked body 100. The insulating layers 50 are respectively formed between the second layer 23 and a first electrode layer 30, between the electrode layers 30, and between an uppermost electrode layer 30 and the electrode layer 40. Note that, two electrode layers 30 are shown in FIG. 4B, for convenience. The electrode layers 30 are actually stacked with the same number as a number of memory cells MC disposed in the Z-direction. An insulating layer 50 may be formed as the top layer of the stacked body 100. The second layer 23, the electrode layers 30 and 40 are, for example, tungsten (W) layers formed using CVD.

Figure 4C:
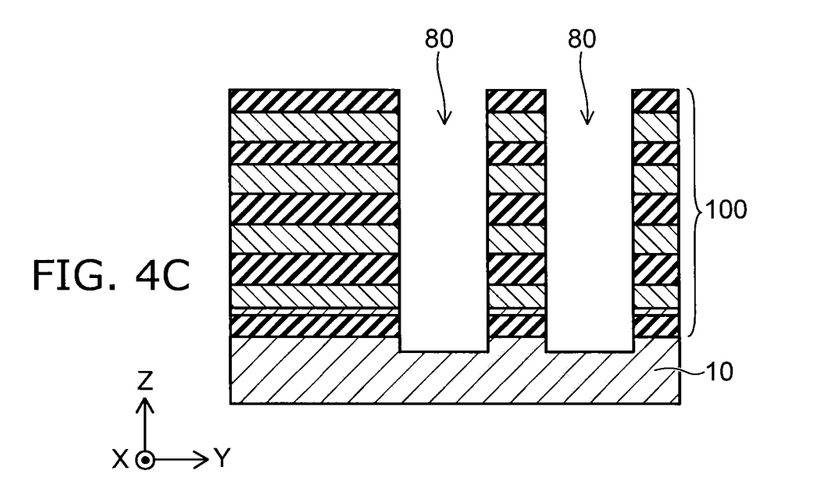

As shown in FIG. 4C, memory holes 80 are formed in the stacked body 100. The memory holes 80 extend in the Z-direction in the stacked body 100. The memory holes 80 are formed at a depth of extending into the source layer 10 from the upper surface of the stacked body 100. A memory hole 80 has, for example, a circular, elliptical, or polygonal shape in top view of the stacked body 100. The memory holes 80 are formed using, for example, anisotropic Reactive Ion Etching (RIE).

Figure 4D:
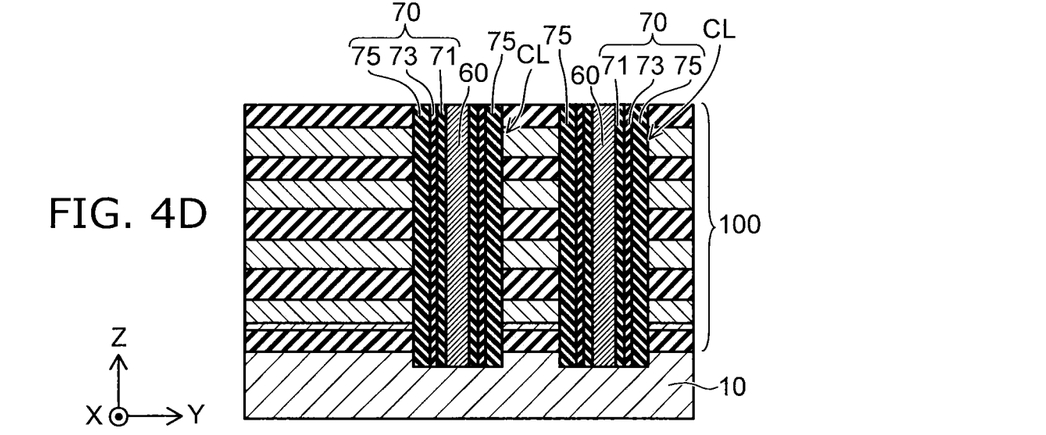

As shown in FIG. 4D, the columnar sections CL are formed inside the memory holes 80. A columnar section CL includes a memory film 70 and a channel body 60. The memory film 70 includes a tunneling insulating film 71, a charge storage portion 73 and an insulative blocking film 75. For example, the insulative blocking film 75 is formed to cover an inner surface of the memory hole 80. Subsequently, the charge storage portion 73 is formed on the insulative blocking films 75. Further, the tunnel insulating film 71 is formed on the charge storage portion 73.

The insulative blocking film 75 is, for example, a silicon oxide film formed using CVD. The charge storage portion 73 is, for example, silicon nitride film formed using CVD. The tunnel insulating film 71 is, for example, a silicon oxide film formed using CVD.

Subsequently, a part of the memory film 70 on the bottom surface of the memory hole 80 and a part of the memory film 70 on the upper surface of the stacked body 100 are selectively removed. For example, the part of the memory film 70 formed on the bottom surface of the memory hole 80 is selectively removed, leaving a part of the memory film 70 formed on the inner wall of the memory hole 80 using an anisotropic RIE. At the same time, the part of the memory film 70 on the upper surface of the stacked body 100 is also removed.

Subsequently, a channel body 60 is formed so as to cover the memory film 70 and the bottom surface of the memory hole 80. The channel body 60 is, for example, a silicon layer formed using CVD. The channel body 60 is electrically connected to the source layer 10 on the bottom surface of the memory hole 80.

Figure 4E:
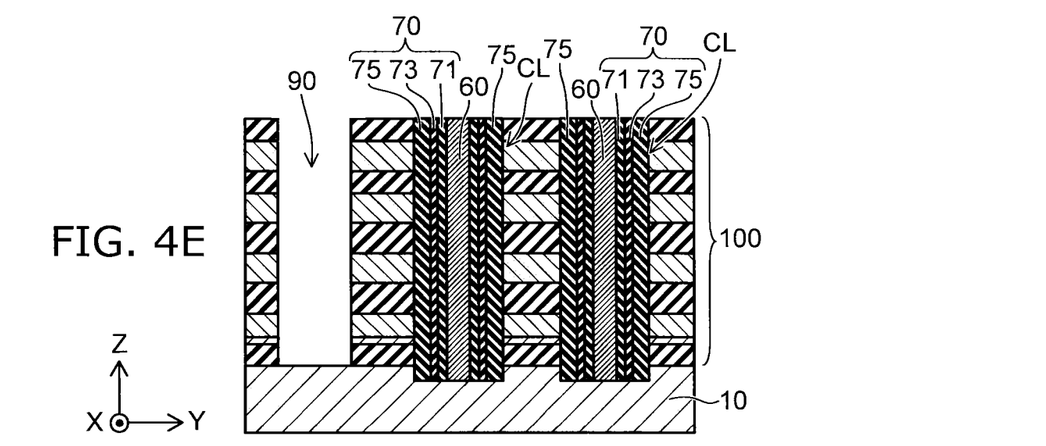

As shown in FIG. 4E, a slit 90 is formed to divide the stacked body 100. The slit 90 is formed, for example, at a depth of extending into the source layer 10 from the upper surface of the stacked body 100 using RIE. The slit 90 is formed in a groove shape extending in the X-direction, for example.

Figure 4F:
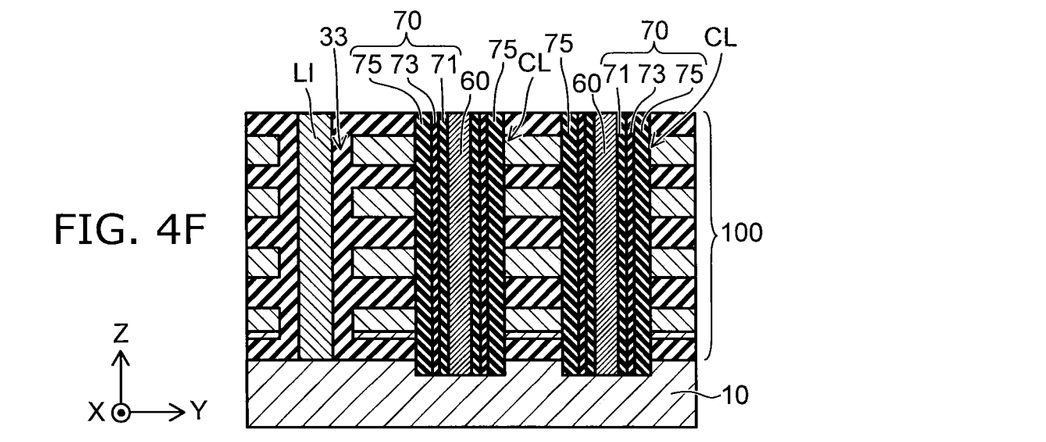

As shown in FIG. 4F, after an insulating film 33 is formed to cover the inner surface of the slit 90, a conductor LI is formed in the slit 90. For example, a silicon oxide film covering the inner surface of the slit 90 is formed using the CVD. Thereafter, for example, by using anisotropic dry etching, the silicon oxide film deposited on the bottom surface is removed leaving a portion deposited on the inner wall of the slit 90 to expose the surface of the source layer 10. Subsequently, tungsten (W) is embedded in the slit 90, for example, to form the conductor LI. Further, bit lines BL and a source line SL are formed above the stacked body 100 and the conductor LI, thereby completing the memory cell array 1.

Figure 5:
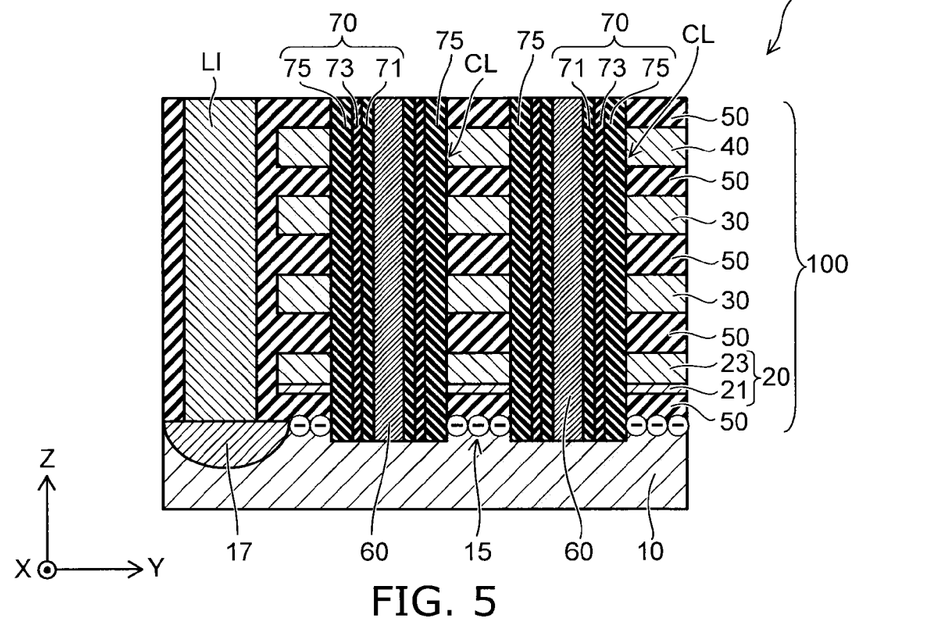
FIG. 5 is a schematic sectional view showing a non-volatile memory device according to a comparative example of the first embodiment.

FIG. 5 is a schematic sectional view showing a memory cell array 2 of a non-volatile memory device according to a variation of the first embodiment. In FIG. 5, a sectional structure of the memory cell array 2 is shown, wherein the stacked number of the electrode layers 30 and the number of columnar sections CL are reduced for convenience.

As shown in FIG. 5, the memory cell array 2 includes a stacked body 100 provided on a source layer 10. A plurality of columnar sections CL extend in the Z-direction in the stacked body 100. A columnar section CL includes a channel body 60 and a memory film 70.

The stacked body 100 includes the electrode layers 20, 30, and 40. The memory cells MC are provided in portions where a columnar section CL extends through the electrode layers 30. The selection transistors STS and STD are respectively provided in portions where the columnar section CL extends through the electrode layers 20 and 40.

The electrode layer 20 is provided at a position closest to the source layer 10 among the plurality of electrode layers 20, 30, and 40. The electrode layer 20 includes the first layer 21 and the second layer 23. The first layer 21 faces the source layer 10 via a bottom layer of the insulating layers 50. The first layer 21 includes a material having a work function smaller than the work function of a material included in the second layer 23 and the electrode layers 30 and 40.

A conductor LI is provided, for example, between the stacked bodies 100 adjacent to each other in the Y-direction. The conductor LI is provided, for example, with a length of extending into the source layer 10 from a surface at the same level as the upper surface of the stacked body 100. In this example, an n-type contact region 17 is provided between the lower end of the conductor LI and the source layer 10. The n-type contact region 17 is in contact with the lower end of the conductor LI. The n-type contact region 17 is preferably formed in contact with the inversion layer 15. Thus, it is possible to reduce the electric resistance between the conductor LI and the channel body 60.

The n-type contact region 17 is formed by, for example, ion-implanting arsenic (As), which is an n-type impurity, into the source layer 10 exposed on the bottom of the slit 90. The n-type impurity implanted into the source layer 10 is activated and driven by heat treatment. It is preferable to expand the n-type contact region 17 in the lateral direction so as to be connected to the inversion layer 15.

In the embodiment, a material having a work function smaller than the work function of the other electrode layers is provided in a part of the electrode layer 20 closest to the source layer 10, and increases the carrier density of the inversion layer 15. Thereby, it becomes possible to reduce the electric resistance between the channel body 60 and the conductor LI and suppress a variation of the channel current flowing through the memory cells MC. As a result, for example, it is possible to improve a performance of the non-volatile memory device, such as the accuracy of the data readout from the memory cells MC.

Second Embodiment

Figure 6:
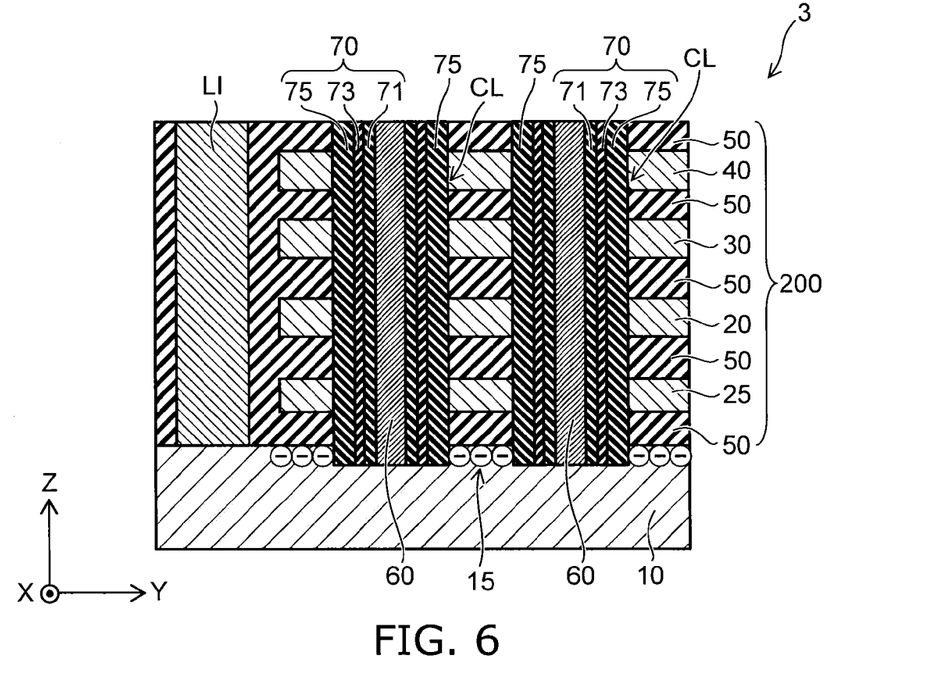
FIG. 6 is a schematic sectional view showing a non-volatile memory device according to a second embodiment.

FIG. 6 is a schematic sectional view showing a memory cell array 3 of a non-volatile memory device according to a second embodiment. In FIG. 6, a sectional structure of a memory cell array 3 is shown, wherein the stacked number of the electrode layers 30 and the number of the columnar sections CL is reduced for convenience.

The memory cell array 3 includes a stacked body 200 provided on a source layer 10. A plurality of columnar sections CL extend in the Z-direction in the stacked body 200. A columnar section CL includes a channel body 60 and a memory film 70.

The stacked body 200 includes electrode layers 20, 25, 30, and 40 and insulating layers 50. The electrode layer 25 is provided between the source layer 10 and the electrode layer 20. The insulating layers 50 are respectively provided between the source layer 10 and the electrode layer 25, between the electrode layer 25 and the electrode layer 30, and between the electrode layer 30 and the electrode layer 40. In FIG. 6, one electrode layer 30 is shown for convenience. The same number of electrode layers 30, however, is actually stacked as a number of the memory cells MC disposed in the Z-direction. The insulating layers 50 are also provided respectively between the electrode layers 30 adjacent to one another in the Z-direction. An insulating layer 50 may be provided as a top layer of the stacked body 200.

The memory cells MC are provided in portions where a columnar section CL extends through the electrode layers 30. The selection transistors STS and STD are respectively provided in portions where the columnar section CL extends through the electrode layers 20 and 40.

The electrode layer 25 faces the source layer 10 via a bottom layer of the insulating layers 50. The electrode layer 25 includes a material having a work function smaller than the work function of the material included in the electrode layers 20, 30, and 40. Thus, it becomes possible to increase the electron density of the inversion layer 15 and reduce the electric resistance of the inversion layer 15.

A method for manufacturing the non-volatile memory device according to the second embodiment is described with reference to FIGS. 7A to 7H. FIGS. 7A to 7H are schematic sectional views showing a manufacturing process of the memory cell array 3 in order.

Figure 7A:
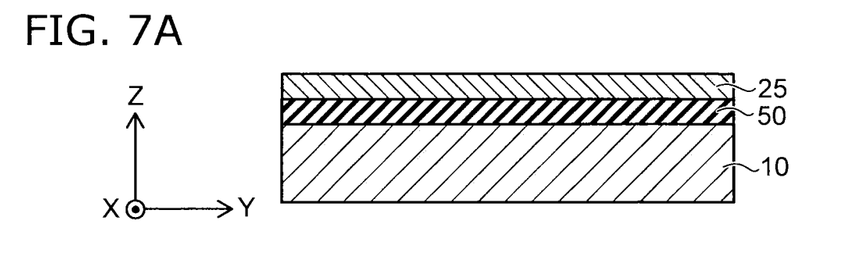
FIGS. 7A to 7H are schematic sectional views showing a manufacturing process of the non-volatile memory device according to the second embodiment.

As shown in FIG. 7A, an insulating layer 50 is formed on a source layer 10. An electrode layer 25 is formed on the insulating layer 50. The insulating layer 50 is, for example, a silicon oxide film formed using CVD. The electrode layer 25 includes, for example, tantalum carbide (TaC) formed using CVD.

Figure 7B:
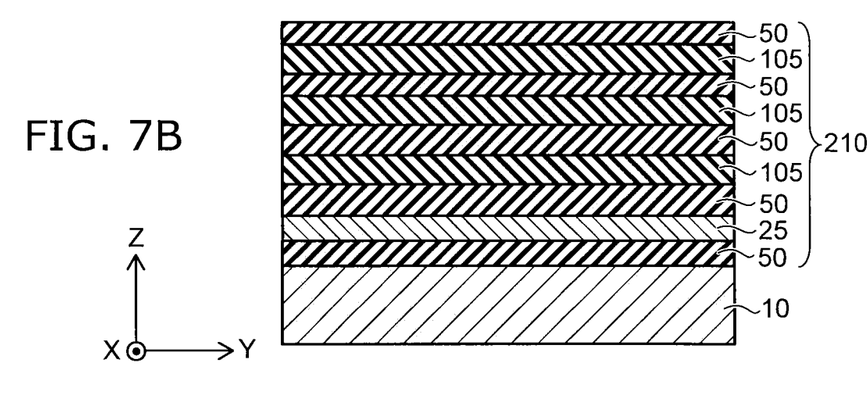

As shown in FIG. 7B, a stacked body 210 including insulating layers 50 and sacrificial layers 105 is formed on the electrode layer 25. Each insulating layer 50 and each sacrificial layer 105 are alternately stacked on the electrode layer 25. The insulating layers 50 are, for example, silicon oxide layers formed using CVD. The sacrificial layers 105 are, for example, silicon nitride layers formed using CVD. A sacrificial layer 105 includes a material having an etching selectivity against the material included in the insulating layers 50. That is, it is preferable to use a material for the sacrificial layers 105, which is capable of being etched under a condition where an etching rate of the insulating layers 50 is less than the etching rate of the sacrificial layers 105.

Figure 7C:
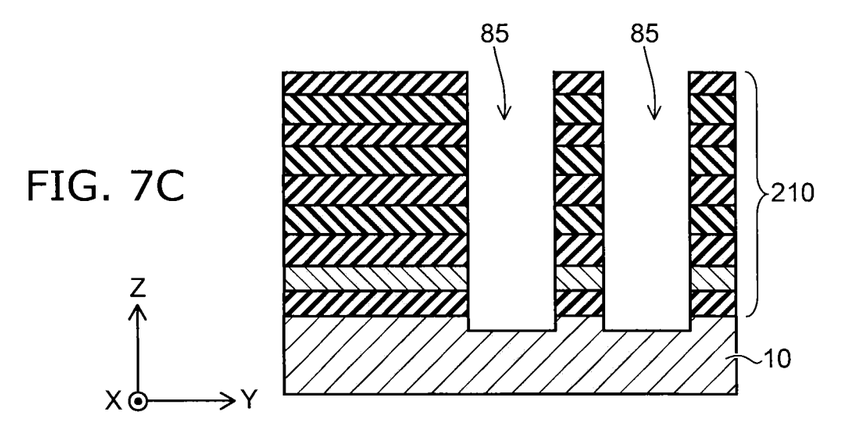

As shown in FIG. 7C, memory holes 80 are formed in the stacked body 210. A memory hole 80 extends in the Z-direction in the stacked body 210. The memory holes 80 are formed with a depth of extending into the source layer 10 from the upper surface of the stacked body 210. The memory holes 80 have, for example, a circular, elliptical, or polygonal shape in top view of the stacked body 210. The memory holes 80 are formed using, for example, an anisotropic RIE (Reactive Ion Etching).

Figure 7D:
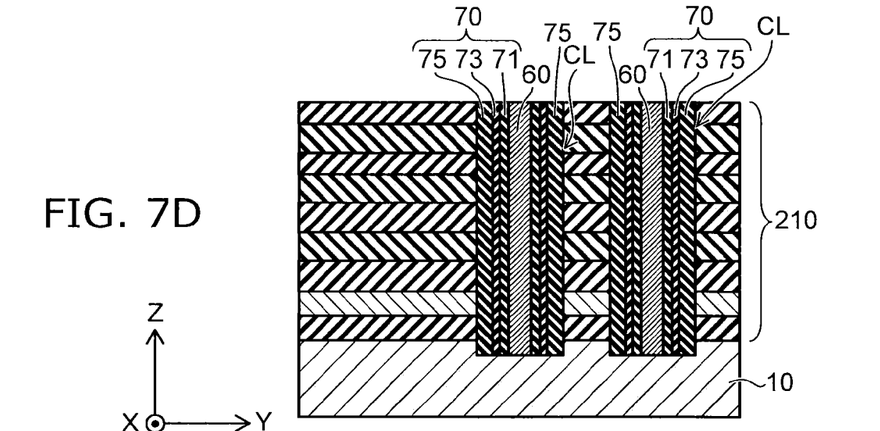

As shown in FIG. 7D, a columnar section CL is formed in the memory hole 80. The columnar section CL includes a memory film 70 and a channel body 60. The memory film 70 includes a tunneling insulating film 71, a charge storage portion 73 and an insulative blocking film 75. For example, the insulative blocking film 75 is formed to cover the inner surfaces of the memory holes 80. Subsequently, the charge storage portion 73 is formed on the insulative blocking film 75. Further, the tunnel insulating film 71 is formed on the charge storage portion 73.

Subsequently, parts of the memory films 70 on the bottom surfaces of the memory holes 80 and the upper surface of the stacked body 210 are selectively removed, leaving a part on the inner wall of the memory hole 80. Thereafter, the channel body 60 is formed to cover the memory film 70 and the bottom surface of the memory holes 80. The channel body 60 are, for example, a silicon layer formed using CVD. The channel body 60 is in contact with the source layer 10 at the lower end thereof.

Figure 7E:
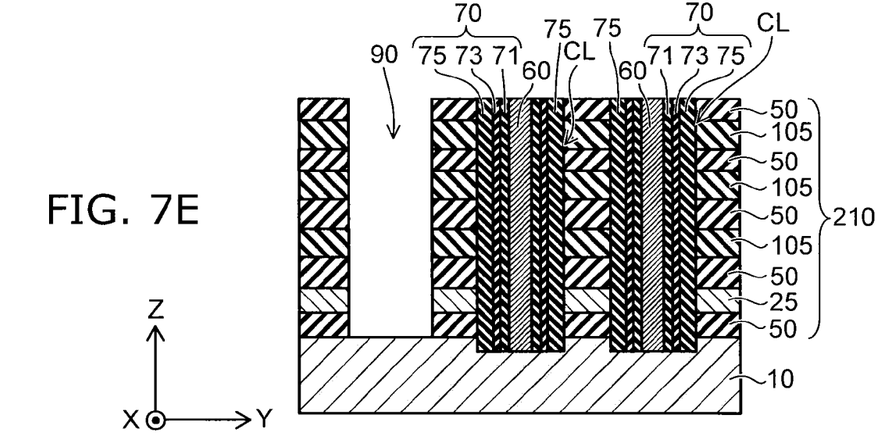

As shown in FIG. 7E, a slit 90 is formed to divide the stacked body 210. The slit 90 is formed, for example, with a depth of extending into the source layer 10 from the upper surface of the stacked body 210 using RIE. The slit 90 is formed in a groove shape extending in the X-direction, for example.

Figure 7F:
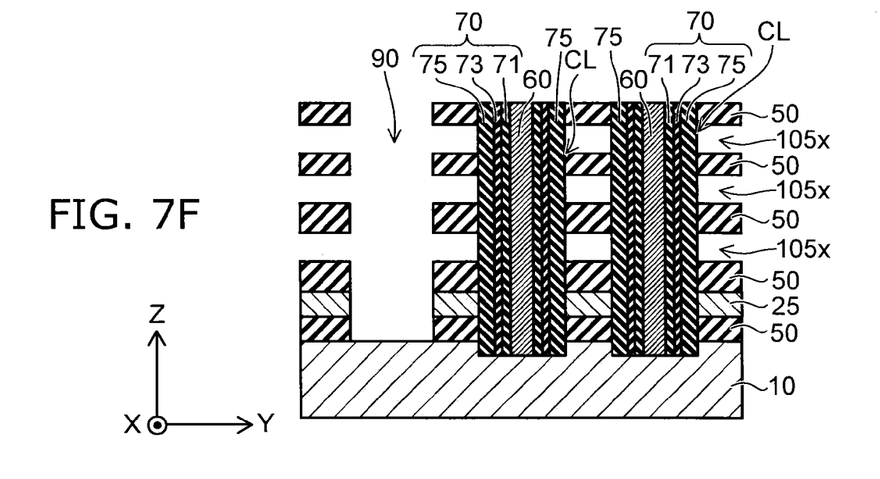

As shown in FIG. 7F, the sacrificial layers 105 are selectively removed. For example, etching liquid is supplied via the slit 90 so as to selectively remove the sacrificial layers 105, leaving the insulating layers 50. For example, the sacrificial layers 105 including silicon nitride are removed using hot phosphoric acid.

Figure 7G:
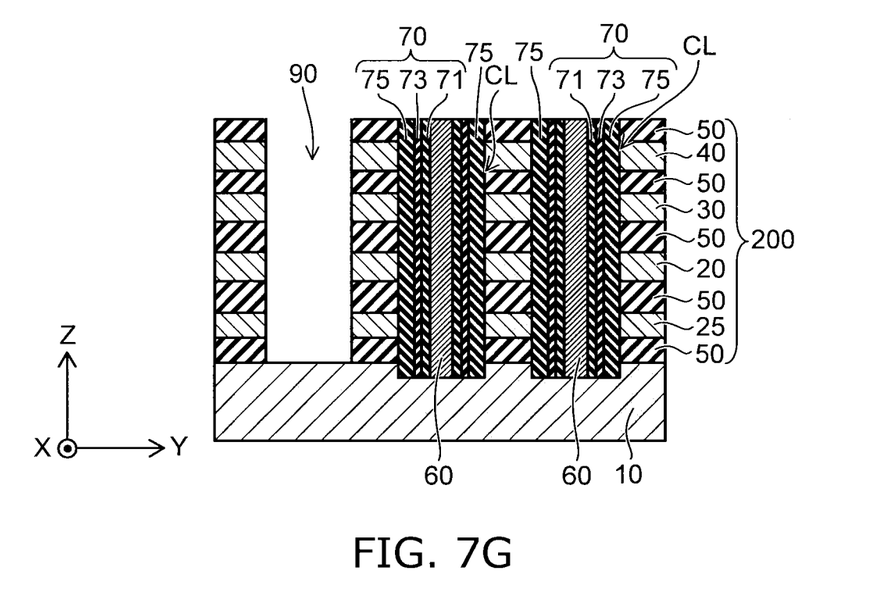

As shown in FIG. 7G, the electrode layers 20, 30, and 40 are formed in spaces 105x that are formed after the etching liquid removes the sacrificial layers 105. The electrode layers 20, 30, and 40 are, for example, metal layers of tungsten or the like formed using CVD. A material gas of the CVD is supplied to the spaces 105x, for example, via the slit 90.

Figure 7H:
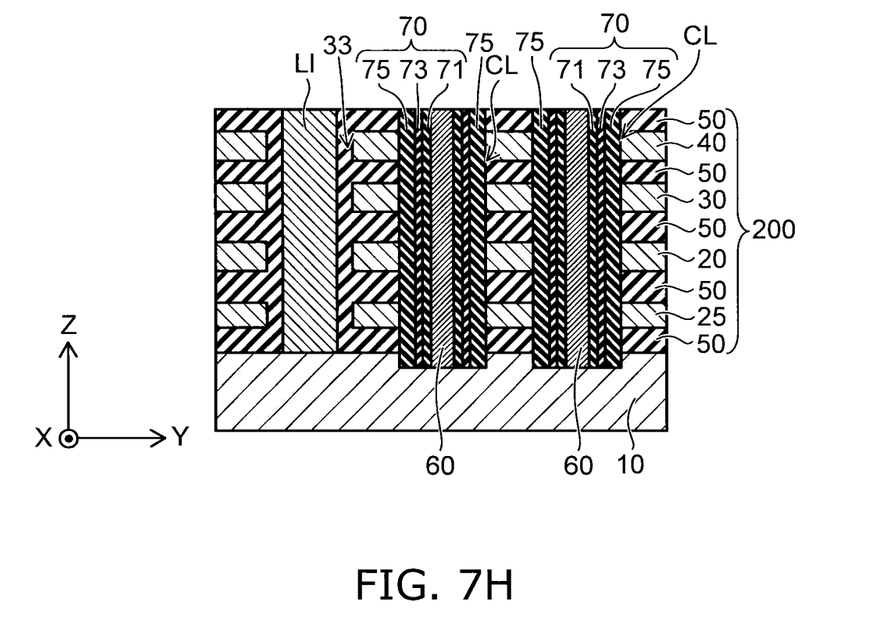

As shown in FIG. 7H, a conductor LI is formed in the slit 90. For example, after removing the metal layer deposited on the inner surface of the slit 90, an insulating film 33 is formed using CVD to cover the inner surface of the slit 90. Further, a part of the insulating film 33 on the bottom surface of the slit 90 is selectively removed to expose the surface of the source layer 10. For example, by using an anisotropic dry etching, a part of the insulation film 33 deposited on the bottom surface of the slit 90 is removed leaving a part deposited on the inner wall of the slit 90. Thereafter, for example, tungsten (W) is embedded in the slit 90 to form the conductor LI. Subsequently, the bit lines BL and the source line SL are formed above the stacked body 210 and the conductor LI, thereby completing the memory cell array 3.

In the embodiment, the electrode layer 25, which faces the source layer 10 via the insulating layer 50, may increase the electron density of the inversion layer 15 and reduce the electric resistance of the inversion layer 15. Thereby, it becomes possible to suppress a variation of a channel current flowing through the memory cells MC and improve the performance of the non-volatile memory device.

Third Embodiment

Figure 8:
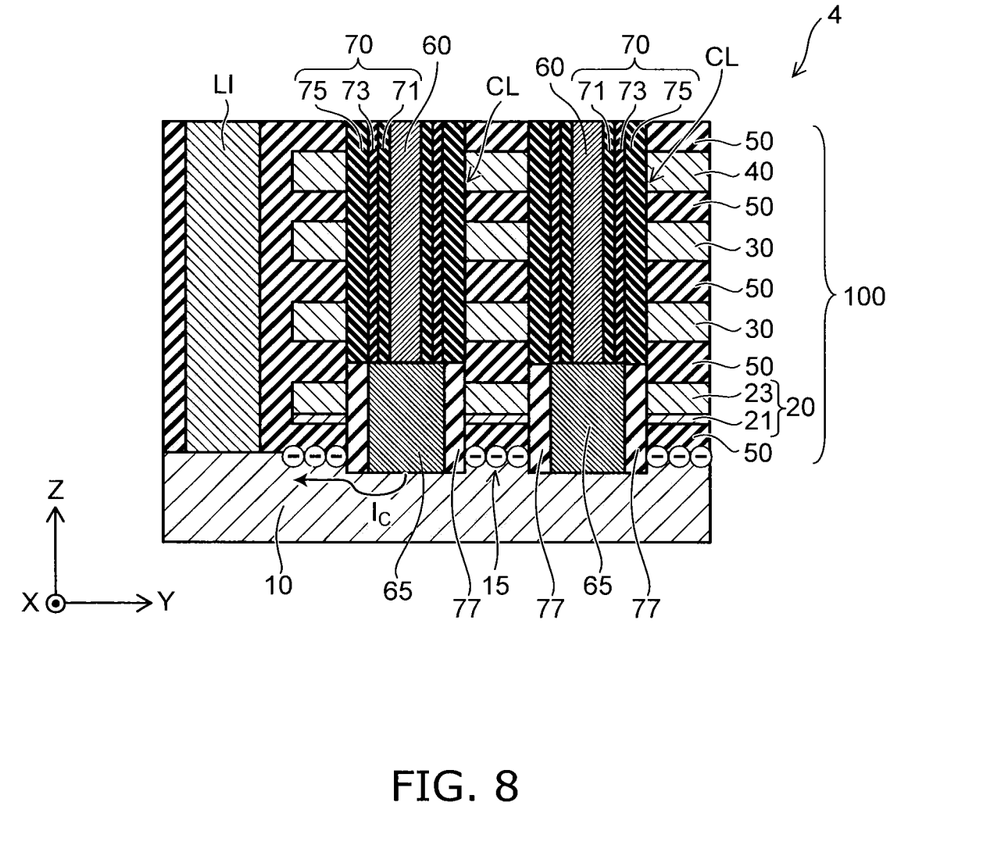
FIG. 8 is a schematic sectional view showing a non-volatile memory device according to a third embodiment.

FIG. 8 is a schematic sectional view showing a memory cell array 4 of a non-volatile memory device according to a third embodiment. In FIG. 8, a sectional structure of the memory cell array 4 is shown, wherein the stacked number of the electrode layers 30 and the number of columnar sections CL is reduced for convenience.

The memory cell array 4 includes a stacked body 100 provided on a source layer 10. A plurality of columnar sections CL extend in the Z-direction in the stacked body 100. Each columnar section CL includes a channel body 60, a channel body 65, a memory film 70 and a gate insulating film 77.

The stacked body 100 includes electrode layers 20, 30, and 40 and insulating layers 50. The electrode layer 20 is provided between the source layer 10 and the electrode layer 30. The insulating layers 50 are respectively provided between the source layer 10 and the electrode layer 20, between the electrode layer 20 and the electrode layer 30, and between the electrode layer 30 and the electrode layer 40. In FIG. 8, one electrode layer 30 is shown for convenience. The same number of the electrode layers 30, however, is actually stacked as a number of the memory cells MC disposed in the Z-direction. The insulating layers 50 are also provided respectively between the electrode layers 30 adjacent to one another in the Z-direction. An insulating layer 50 may be formed on the electrode layer 40 as a top layer of the stacked body 100.

The channel body 60 extends through the electrode layers 30 and the electrode layer 40. The channel body 65 is provided between the source layer 10 and the channel body 60. The channel body 65 extends through the electrode layer 20. The channel body 65 is in contact with the source layer 10 at the lower end thereof and is in contact with the channel body 60 at the upper end thereof. The channel body 65 is, for example, an epitaxial growth layer formed on the source layer 10 in a memory hole 80. The channel body 65 is, for example, a silicon layer.

A memory cell MC is provided in a portion where the columnar section CL extends through the electrode layer 30. The memory cell MC includes the electrode layer 30, a part of the channel body 60, and a part of the memory film 70 provided between the electrode layer 30 and the channel body 60. The electrode layer 30 acts as a control gate electrode.

A selection transistor STD is provided in a portion where the columnar section CL extends through the electrode layer 40. The selection transistor STD includes the electrode layer 40, a part of the channel body 60 and a part of the memory film 70. The electrode layer 40 acts as a selection gate. The part of the memory film 70 acts as a gate insulating film.

The selection transistor STS is provided in a portion where the columnar section CL extends through the electrode layer 20. The selection transistor STS includes the electrode layer 20, the channel body 65, and the gate insulating films 77 provided between the electrode layer 20 and the channel body 65. The electrode layer 20 acts as a control gate electrode.

The electrode layer 20 includes a first layer 21 and a second layer 23. The first layer 21 faces the source layer 10 via an insulating layer 50. The second layer 23 is directly provided on the first layer 21. The first layer 21 includes a material having a work function smaller than the work function of a material included in the electrode layers 30 and 40 and the second layer 23. Thereby, the first layer 21 may increase the electron density of the inversion layer 15 formed on the upper surface of the source layer 10 and reduce the electric resistance of the inversion layer 15.

In the embodiment, reducing the electric resistance of the inversion layer 15 and providing the channel body 65 may increase the current capacity of the selection transistor STS. Thereby, it becomes possible to suppress a variation of the channel current Ic flowing in the columnar sections CL.

The first to third embodiments are described above. The embodiments, however, are not limited thereto. Although the electrode layers 20, 30, and 40 in the second embodiment is formed by replacing the sacrificial layers 105 with metal layers, the electrode layers 20, 30, and 40 may be formed by stacking in order on the electrode layer 25 as described in the first embodiment. The memory cell array 1 according to the first embodiment may be also formed using a method of replacing the sacrificial layers 105 with metal layers. The n-type contact region 17 shown in FIG. 5 may be provided in the memory cell arrays 3 and 4 shown in FIGS. 6 and 8. The columnar sections CL shown in FIGS. 2A, 5, 6, and 8 extend into the source layer 10. The embodiments, however, are not limited thereto. For example, the lower ends of the columnar sections CL may be located at a level of the interface between the source layer 10 and the insulating layer 50 or in the vicinity thereof in a direction perpendicular to the interface. The components indicated by the same reference numerals and signs are common to one another and may provide the same advantage over the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A non-volatile memory device comprising:
a source layer;
a first electrode layer stacked on the source layer in a first direction;
a second electrode layer provided between the source layer and the first electrode layer, the second electrode layer including a first layer and a second layer stacked in the first direction, the first layer being provided between the source layer and the second layer, wherein the first layer has a work function smaller than a work function of the first electrode layer, and the second layer has a work function larger than the work function of the first layer;
a first channel body extending through the first electrode layer in the first direction; and
a charge storage portion provided between the first electrode layer and the first channel body.

2. The device according to claim 1, wherein
the first electrode layer includes tungsten, and
the second electrode layer includes at least one of tantalum, hafnium, titanium, tantalum carbide, hafnium carbide, and tantalum nitride.

3. The device according to claim 1, further comprising:
a first insulating film provided between the charge storage portion and the first channel body; and
a second insulating film provided between the charge storage portion and the first electrode.

4. The device according to claim 3, wherein the second insulating film extends in the first direction and an end of the second insulating film is located in the source layer.

5. The device according to claim 3, wherein the first insulating film includes at least one of silicon oxide and silicon nitride.

6. The device according to claim 3, wherein the second insulating film includes at least one of silicon oxide and silicon nitride.

7. The device according to claim 3, wherein the second insulating film has a multilayer structure.

8. The device according to claim 1, wherein the first channel body is in contact with the source layer.

9. The device according to claim 1, wherein the charge storage portion includes at least one of silicon oxide, silicon nitride, polycrystalline silicon, and metal.

10. The device according to claim 6, wherein the charge storage portion includes a multilayer structure.

11. The device according to claim 1, further comprising a second channel body provided between the source layer and the first channel body and extending through the second electrode layer.

12. The device according to claim 11, further comprising a third insulating film provided between the second electrode layer and the second channel body.

13. The device according to claim 11, wherein the second channel body is in contact with the source layer and the first channel body.

14. The device according to claim 1, further comprising a conductor provided side by side with the first electrode layer in a second direction along a surface of the source layer, the conductor being electrically connected to the source layer.

15. The device according to claim 14, further comprising a region provided on the source layer, the region having a conductivity type opposite to a conductivity type of the source layer, and being in contact with the conductor.

16. The device according to claim 14, further comprising a first interconnect provided above the conductor in the first direction, wherein
the conductor is located between the first interconnect and the source layer and electrically connects the first interconnect and the source layer.

17. The device according to claim 1, further comprising a second interconnect provided above the first electrode layer in the first direction, wherein
the first electrode layer and the second electrode layer are provided between the second interconnect and the source layer, and the first channel body is electrically connected to the second interconnect.

\* \* \* \* \*